United States Patent
Washburn et al.

(10) Patent No.: US 7,352,312 B2
(45) Date of Patent: Apr. 1, 2008

(54) VARIABLE PASSIVE COMPONENTS WITH HIGH RESOLUTION VALUE SELECTION AND CONTROL

(76) Inventors: Robert D. Washburn, 18425 Kingsport Dr., Malibu, CA (US) 90265; Robert F. McClanahan, 27781 Sequoia Glen Dr., Valencia, CA (US) 90265

(*) Notice: Subject to any disclaimer, the term of this patent is extended or adjusted under 35 U.S.C. 154(b) by 0 days.

(21) Appl. No.: 11/557,425

(22) Filed: Nov. 7, 2006

(65) Prior Publication Data
US 2007/0194813 A1 Aug. 23, 2007

Related U.S. Application Data
(60) Provisional application No. 60/734,516, filed on Nov. 7, 2005.

(51) Int. Cl.
*H03M 1/66* (2006.01)
(52) U.S. Cl. .................. 341/144; 341/120; 341/142
(58) Field of Classification Search ............... 341/118, 341/120, 139, 142, 144
See application file for complete search history.

(56) References Cited

U.S. PATENT DOCUMENTS

| | | | |
|---|---|---|---|
| 6,917,316 B2* | 7/2005 | Blackburn | 341/118 |
| 6,940,440 B1* | 9/2005 | Iacob | 341/144 |
| 6,977,602 B1* | 12/2005 | Ostrem et al. | 341/145 |
| 6,995,700 B2* | 2/2006 | Roger et al. | 341/144 |
| 7,030,793 B2* | 4/2006 | McLeod et al. | 341/119 |
| 7,098,830 B2* | 8/2006 | Lin et al. | 341/144 |
| 2002/0121995 A1* | 9/2002 | Tabler | 341/145 |
| 2004/0080441 A1* | 4/2004 | Plymale et al. | 341/144 |
| 2005/0062629 A1* | 3/2005 | Roger et al. | 341/144 |
| 2006/0092062 A1* | 5/2006 | Pan | 341/144 |
| 2006/0092065 A1* | 5/2006 | Pan | 341/154 |
| 2007/0085719 A1* | 4/2007 | Maxim et al. | 341/144 |

* cited by examiner

*Primary Examiner*—Linh Nguyen
(74) *Attorney, Agent, or Firm*—J. D. Harriman, II; DLA Piper US LLP

(57) ABSTRACT

The present system provides a method for varying the value of passive components in electronic circuits. Passive components can range from basic resistors, capacitors, and inductors to complex, structures such as transmission lines and resonant cavities. Value selection and variation can either be dynamically performed during circuit operation or as a one-time part of the manufacturing process as determined by the requirements of the specific application. A digital-to-analog converter (DAC) circuit is used to input value selection data digitally, and control value selection with value resolution dependent on the resolution of the DAC. An alternate embodiment is provided for high frequency operation.

14 Claims, 12 Drawing Sheets

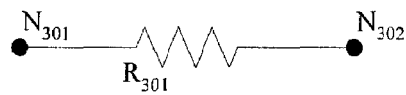
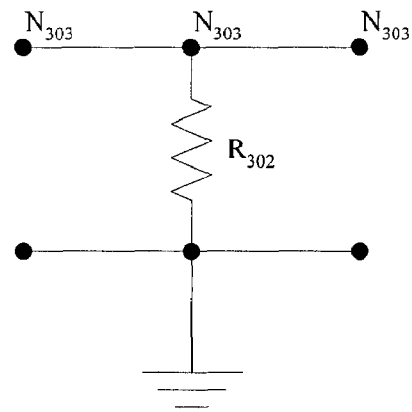
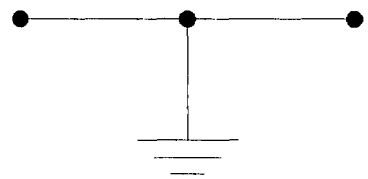
Figure 3A
Figure 3B
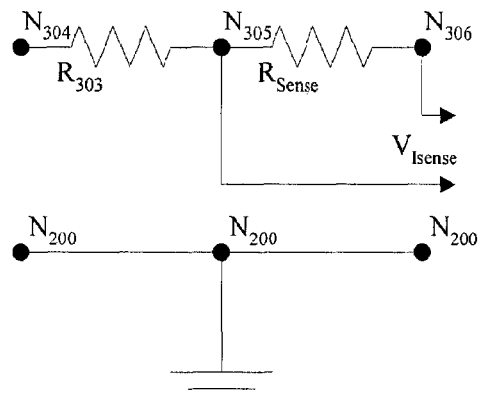
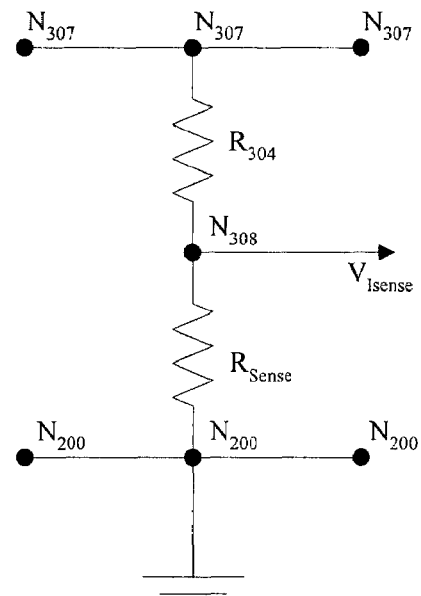
Figure 3C
Figure 3D
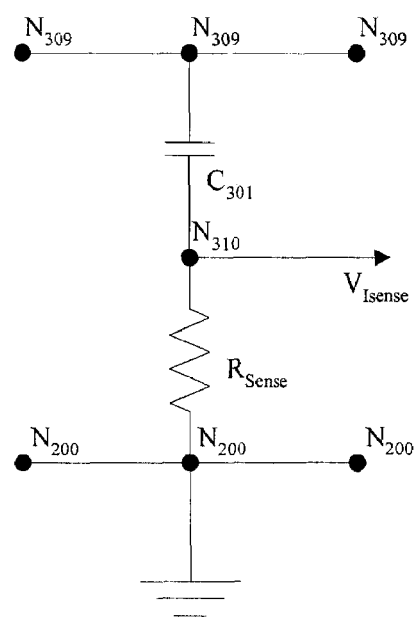
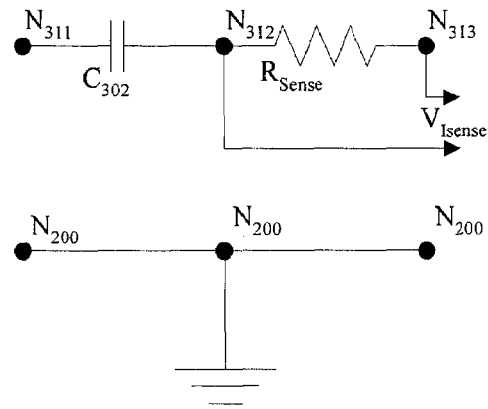
Figure 3F
Figure 3E

VARIABLE PASSIVE COMPONENTS WITH HIGH RESOLUTION VALUE SELECTION AND CONTROL

CROSS-REFERENCE TO RELATED APPLICATIONS

This application claims the benefit of U.S. provisional patent application No. 60/734,516, filed Nov. 7, 2005, which is herein incorporated by reference in its entirety.

BACKGROUND

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

1. Field

The present system relates to the field of variable, passive, electronic components.

2. Background Art

Throughout the history of electronics, the inherent characteristics and consequences associated with the presence of fixed value passive components have impacted circuit performance. The characteristics include component tolerances, tolerance build-up, the relatively high cost of using high precision components, added circuitry required to provide precision control or precisely set component values or performance characteristics, and changes in component value or performance produced by component aging, operating history, and changes in environmental conditions.

FIG. 1 illustrates an idealized solution in the form of variable resistor R100, varaiable capacitor C100 and variable inductor L100. These components would be comparable in nature to the present passive devices they would replace, but whose value could be adjusted to provide nearly nominal performance over widely varying operating conditions. Variability would either be part of the manufacturing processes, or dynamically available during actual operation, as determined on a case-by-case basis. One useful application illustrated is directed toward providing a matched, complex termination (Z100) for a transmission line structure (TL100).

As a result of the long-recognized benefits associated with use of variable passive components, techniques have been made developed to provide this capability using the present art. The effectiveness of the techniques is generally limited to specific types of components over a limited range of operating conditions, such as frequency or power level. One example of a digitally controlled, variable resistor of the present art is shown in FIG. 2A. A switched resistor network is used with control FETs such that turning one or more FETs "on" places resistors in parallel, reducing the effective resistive value of the combination. Resistor networks are more frequently implemented as series structures with one or more FETs used to short out unwanted resistors in the chain. For resistors, value selection controls are far simpler with series connection. Switched capacitor structures are typically configured as parallel networks, again simplifying value selection controls.

Other implementations of variable value components generally realize the function but can have significant impact on the circuit or limited performance. FIG. 2B illustrates the use of the channel resistance of a FET as a variable resistor (note resistor R206 is variable implying some form of gate voltage control). Among the undesirable characteristics of this approach are the large number of unused components and the characteristics of the FET switches. When a value has been selected, there are typically many unused components. This is typically not a major issue for an integrated resistor network but switched capacitor networks can require discrete capacitors to realize large values, adding cost and using circuit board area that could be used for functioning circuitry.

The switch FETs also can present significant problems. If kept small to minimize chip area utilization, they tend to have significant resistance that is aggravated by their rapid resistance increase with temperature (a sensitivity experienced to an even greater degree by the circuit for FIG. 2B). If the FETs are enlarged to reduce resistance, they consume greater area. Either way, there is an incentive to minimize the number of switched devices (4-bit is most common with 8-bit the maximum generally encountered), thereby limiting resolution of the component value.

FIG. 2C illustrates a varactor diode, which provides the function of a controlled variable capacitor. Implementation requires a DC control voltage and DC isolation. Use is generally limited to RF applications where the small diode capacitance under reverse junction bias yields appropriate values for circuit operation.

Inductors are particularly difficult components in which to implement variability because they frequently are wound around a magnetic core material. Modification of the geometric relationship between the core material and the winding provides inductance adjustment capacity. However, the adjustment capacity is typically a mechanical setting with real time adjustment being largely impractical, particularly at high frequencies.

A significant issue associated with realization of component value variability is energy storage, which is a function of the component value (whether primary or parasitic in nature). Alteration of a component value typically involves movement of energy into or out of the storage mechanisms associated with the specific type of passive component, thereby significantly limiting the speed of circuit operation. For many applications, it would be highly beneficial to be able to change the apparent component value without requiring significant energy transfer.

It would therefore be highly desirable to implement low cost, high-resolution value variation for common passive components.

SUMMARY

The present system is an electronic, digital-to-analog converter (DAC) circuit that provides means to detect current flowing through a passive component and source or sink additional current such that the value of the passive component appears to vary from its actual or fixed value. The term "fixed value" is not intended to imply that the passive component value does not vary with environmental or circuit application conditions, or include initial tolerance variation. Rather than unchanging, the term "fixed value" means the instantaneous actual value of the component (or component characteristic) in the specific circuit and under the actual environmental conditions in which it is operating.

The present system employs feedback such that the additional current tracks current flowing through the passive component. The DAC functions as a source for the additional current and either supplies it directly or functions as a reference for external current drive circuits. The digital inputs to the DAC function to set the gain of the DAC and thereby provide high-resolution adjustment of the equivalent variable component value. Resolutions equal to or greater than 24-bits may be realized, where the resolution is primarily limited by the combined DAC operating frequency and resolution in each specific application.

In one or more embodiments, the present system is coupled to a fixed value passive component within an electronic circuit, whereby operation of the present system produces operation by the electronic circuit substantially equivalent to that which would be produced by an altered value of the fixed value passive component.

In one or more embodiments of the present system, the value of the fixed value passive component is a linear component.

In one or more embodiments of the present system, the value of the fixed value passive component is a non-linear component.

In one or more embodiments of the present system, the fixed value passive component is a characteristic of an active component such as a semiconductor junction capacitance.

In one or more embodiments of the present system, a transimpedance amplifier senses the current through the fixed value passive component.

In one or more embodiments of the present system, the output of the transimpedance amplifier is coupled to a DAC voltage reference input.

In one or more embodiments, the present system includes a current sense resistor in series with the fixed value passive component.

In one or more embodiments of the present system, the feedback signal from the current sense resistor coupled to a DAC voltage reference input.

In one or more embodiments, the present system includes a DAC that directly sources or sinks current from the circuit nodes terminating the series combination of the fixed value passive component and the current sense resistor.

In one or more embodiments, the present system includes a DAC that provides reference current for external drive circuitry that sources or sinks current from circuit nodes terminating the series combination of the fixed value passive component and the current sense resistor.

In one or more embodiments, the present system includes external drive circuitry with single sided current sense and single output for driving a shunt passive component with current sense resistor connected to ground.

In one or more embodiments, the present system includes external drive circuitry with differential current sense and differential outputs for driving a series passive component with floating current sense resistor.

In one or more embodiments, the present system includes external drive circuitry for high current applications, including one or more output current amplifiers having both differential inputs and differential outputs.

In one or more embodiments of the present system, the fixed value passive component is a distributed structure such as a transmission line, resonant cavity, slotted line, stub tuner, waveguide or antenna.

In one or more embodiments of the present system, more than one DAC controls current injection or removal from a single pair of nodes.

In one or more embodiments of the present system, current sense feedback is taken from a passive component connected between nodes into which current is neither injected nor removed in response to the current sense feedback.

In one or more embodiments of the present system, the present system provides signals that are coupled between two or more fixed value passive components.

In one or more embodiments, one or more variable components of the present system are varied as a function of frequency such that the circuit functions as a tracking filter.

BRIEF DESCRIPTION OF THE DRAWINGS

FIG. 3A is a circuit diagram of a fixed value, series resistor.

FIG. 3B is a circuit diagram of a fixed value, shunt resistor to ground.

FIG. 3C is a circuit diagram of the resistor of FIG. 3A incorporating a resistive embodiment of the current sense function of the present system.

FIG. 3D is a circuit diagram of the resistor of FIG. 3B incorporating a resistive embodiment of the current sense function of the present system.

FIG. 3E is a circuit diagram of the circuit of FIG. 3C with the fixed value resistor replaced by a fixed value capacitor.

FIG. 3F is a circuit diagram of the circuit of FIG. 3D with the fixed value resistor replaced by a fixed value capacitor.

DETAILED DESCRIPTION OF THE SYSTEM

The present system is directed to variable passive components with high-resolution, digital value selection and control. In the following description, numerous specific details are set forth to provide a more thorough description of embodiments of the system. It is apparent, however, to one skilled in the art, that the system may be practiced without these specific details. In other instances, well known features have not been described in detail so as not to obscure the system. Except as noted herein, common components and connections, identified by common reference designators function in like manner in each circuit.

The present system is a digital-to-analog converter circuit that provides the capability to dynamically vary the apparent value of passive components to the circuitry to which they are coupled in a wide range in analog and mixed signal electronic circuits. The term "fixed value" refers to does not imply that the value of the component does not vary with operating or environmental conditions, but rather represents the component value while operating in the circuitry without operation of the present system to alter its apparent value. The term "passive components" represents either individual discrete passive parts or passive characteristics of other components such as diodes, bipolar junction transistors, FETs, etc. The passive components may be linear or non-linear.

A consideration in implementation of the present system is whether or not the passive component has one of its terminals connected to ground (or either a floating reference or return node). Ground connected components are typically easier to vary with a wider choice of implementations than for an arbitrarily connected passive component.

One element of the present system is a means for sensing the current flowing through the fixed value passive component whose apparent value is to be varied. One example means of current sensing is by the addition of a small value, current sense resistor placed in series with the passive component. FIGS. 3A through 3F illustrate some of the various configurations of passive components, each with current sense resistors added in series.

Figure 1:
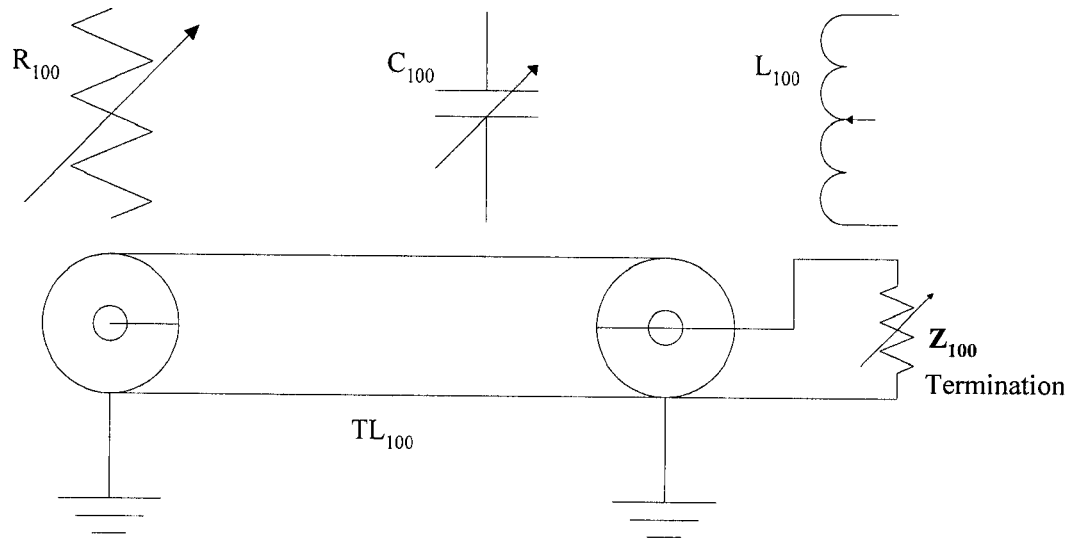
FIG. 1 is an illustration of a number of variable passive components realizable by various embodiments of the present system.
Figure 2A:
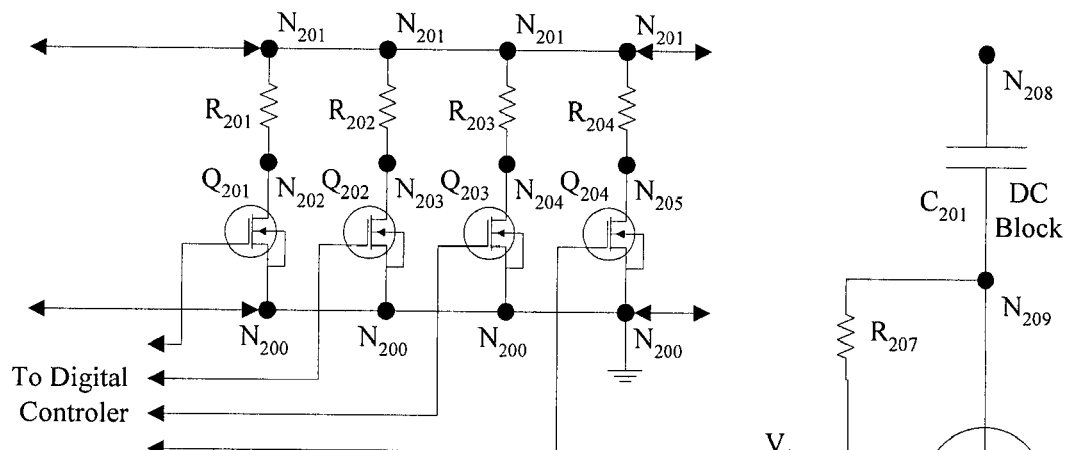
FIG. 2A is a circuit diagram of a switched resistor network.
Figure 2B:
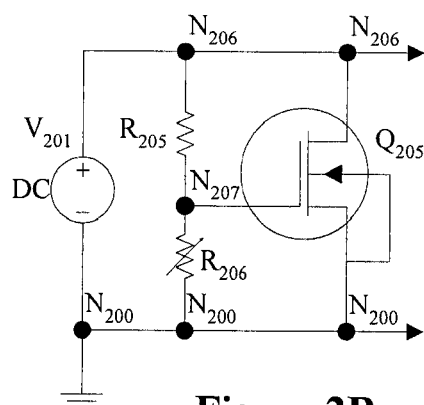
FIG. 2B is a circuit diagram of a FET realization of a variable resistor.
Figure 2C:
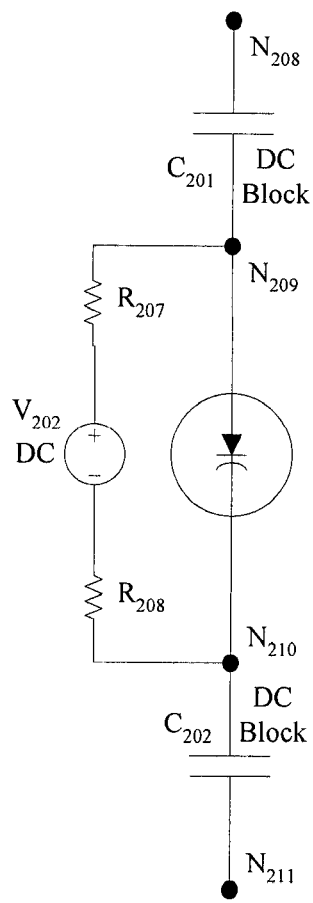
FIG. 2C is a circuit diagram of a varactor diode realization of a variable capacitor.
Figure 3G:
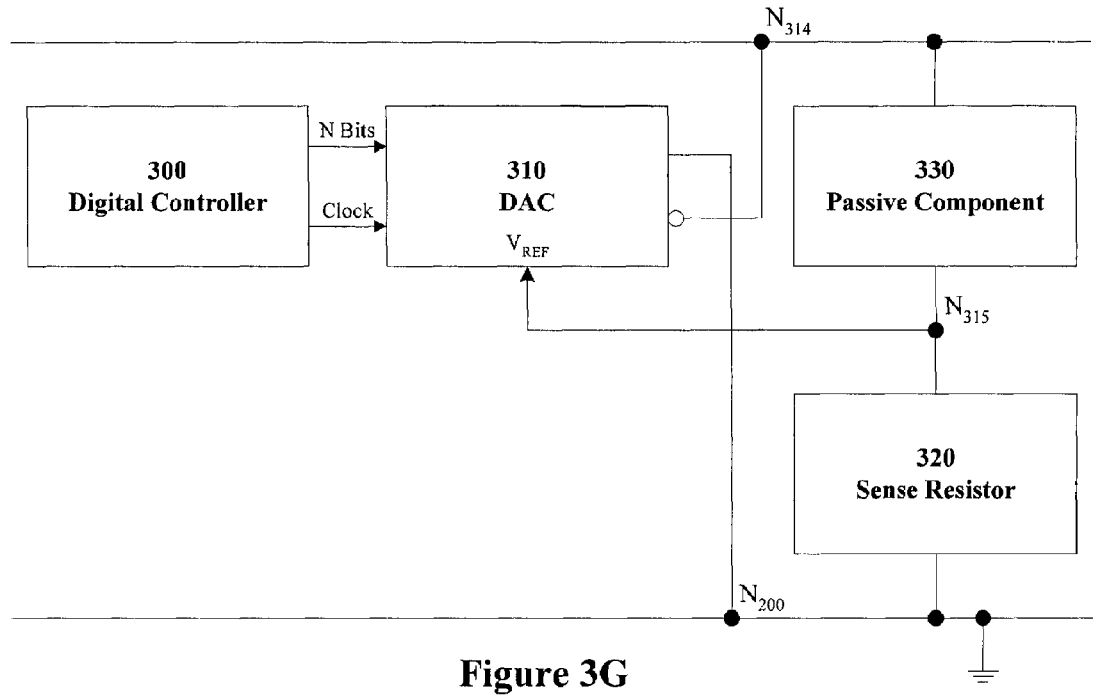
FIG. 3G is a functional block diagram of one embodiment of the present system.

One embodiment of the present system is illustrated in FIG. 3G. DAC310 is a current output DAC with a voltage reference input VREF. Current sense resistor 320 is placed in series with a fixed value passive component 330. The voltage across resistor 320 is a representation of the current through passive component 320 and is applied to the reference input of DAC 310. Within the bandwidth of the DAC reference amplifier, the output current maintains the same characteristic shape as a function of time, as that through the fixed value passive component. Thus the output of the DAC is equivalent to a fixed value passive component of the same type as passive component 330 placed in parallel with passive component 330. The value of the "added parallel component" is determined by scaling of the DAC output current by the DAC digital input setting. For some applications, the apparent value of the fixed value component can be altered intra-cycle up to some frequency.

Figure 8:
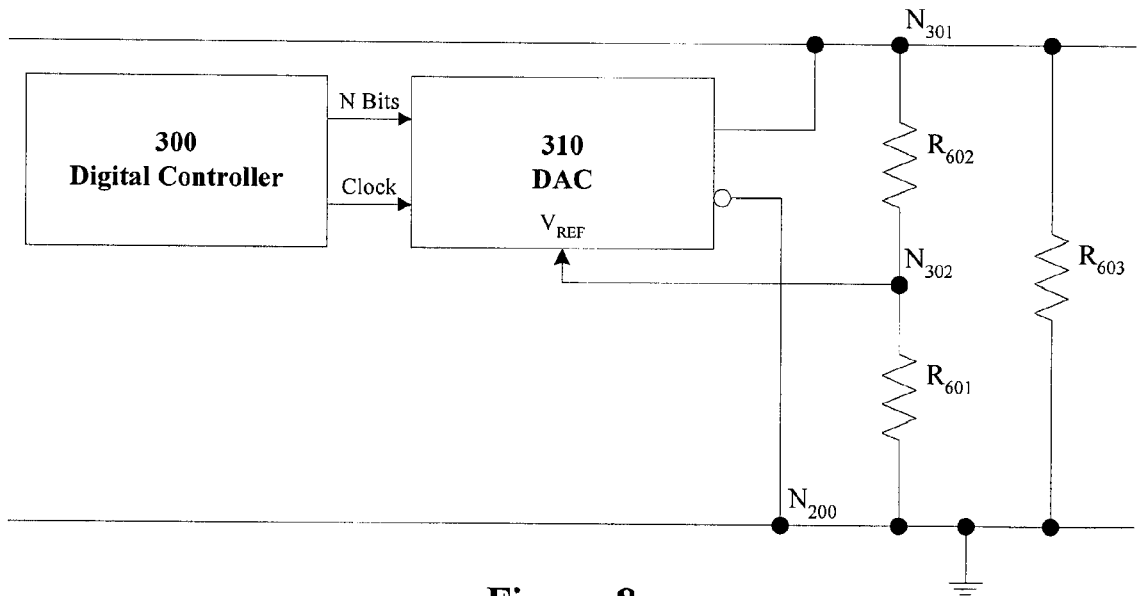
FIG. 8 is a functional block diagram of a variable resistor embodiment of the present system with fine adjustment capability.

As shown in FIG. 3G, the DAC outputs are cross coupled such that positive DAC output current flows in the same direction as a positive current through the sense resistor. If the passive component is a capacitor, the configuration shown would make the capacitor appear larger in value. If the passive component is a resistor or inductor, the apparent parallel combination would be a smaller value. If the positive and negative outputs of the DAC are swapped, as shown in FIG. 8, the capacitor value would apparently decrease and that of a resistor or inductor increase. Thus, the present system can readily produce negative component values. The value change is of course dynamic in nature and does not provide energy storage.

Figure 3H:
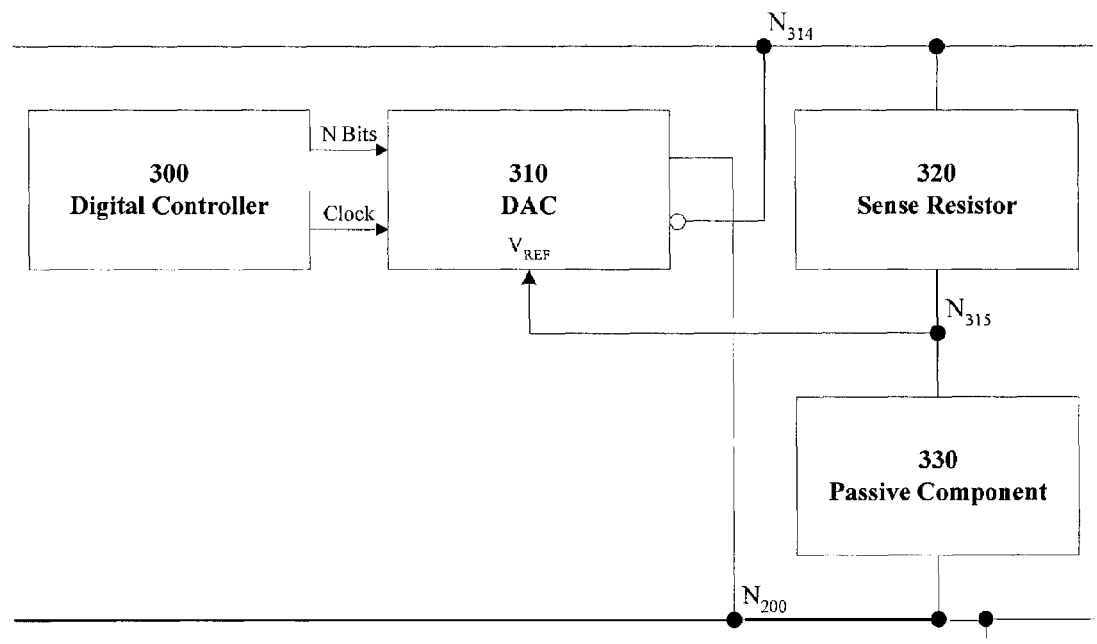
FIG. 3H is a functional block diagram of one embodiment of the present system with floating current sense resistor.

FIG. 3H illustrates an alternate embodiment with floating current sense resistor.

The embodiment of FIG. 3G has 3 is typically used for components that are coupled to ground. An embodiment for use with non-grounded components is discussed below. Note that the addition of any resistance in series with passive component 330 can impact circuit performance for some applications. One alternative is discussed in the Transimpedance Amplifier Current Sense Embodiment below. Further, DACs are typically not designed for this type of application and operate using a DC voltage reference. As a result, the bandwidth of the reference input amplifier may be limited (around 500 KHz). However, in some of the newer DACs, this bandwidth is 10s of MHz. The embodiment for floating components provides a direct means for avoiding the reference amplifier bandwidth limitation and implementing the present system at RF frequencies.

Transimpedance Amplifier Current Sense Embodiment

Figure 3I:
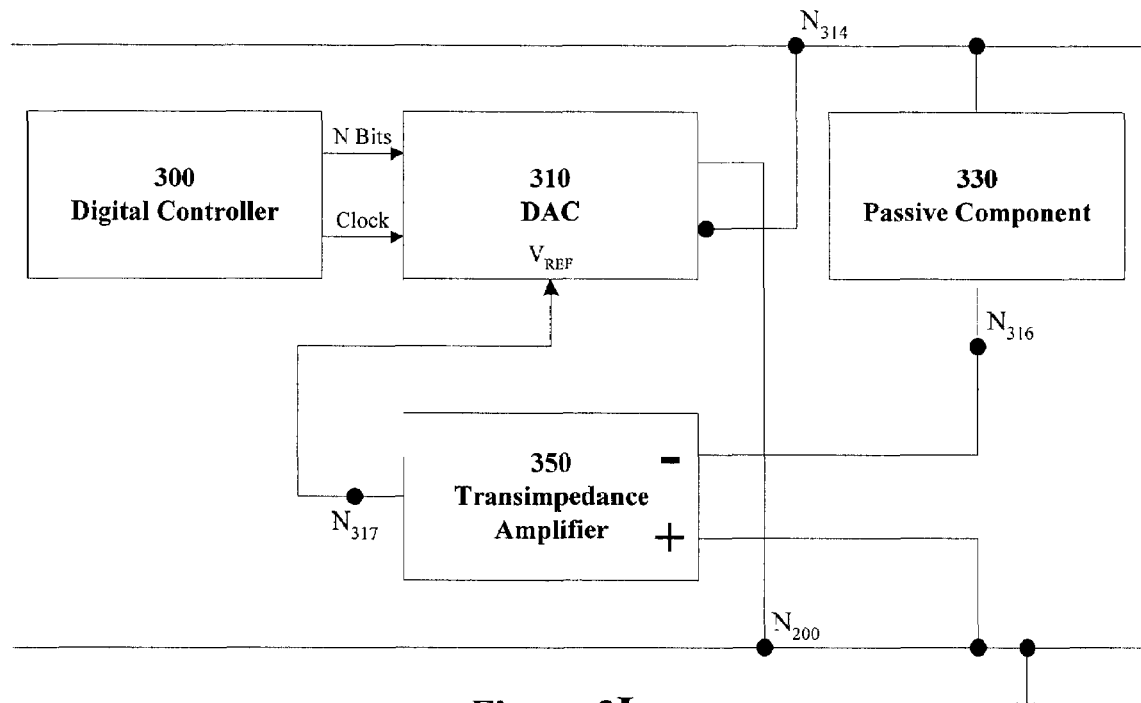
FIG. 3I is a functional block diagram of the preferred embodiment of the present system incorporating zero impedance current sense.
Figure 3J:
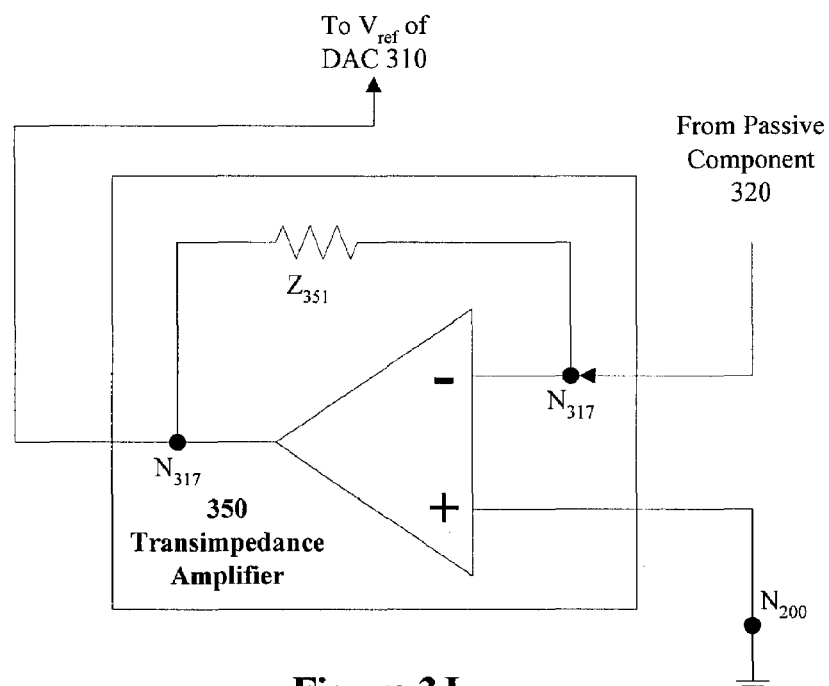
FIG. 3J is a simplified circuit diagram of the transimpedance amplifier function shown in FIG. 3I.

FIGS. 3I and 3J illustrate a method for sensing the current in shunt components to ground when feasible. Within the bandwidth of the transimpedance amplifier, the current is sensed while the passive component terminal is held at virtual ground. Use of the transimpedance amplifier avoids performance degradation caused by the presence of a current sense resistor or any offset voltage associated with the DAC reference amplifier that may or may not be easily correctable.

Wideband transimpedance amplifiers are realizable with appropriately designed feedback. It is desirable to have the transimpedance amplifier circuitry integrated into the DAC integrated circuit with external feedback selection by the user. FIG. 3J illustrates an embodiment of a transimpedance amplifier 350.

Variable Component Equivalent Circuit

Figure 4A:
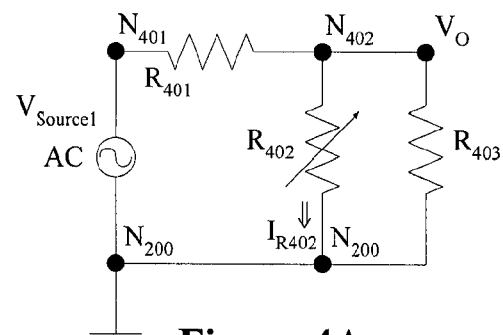
FIG. 4A is a circuit diagram illustrating use of variable component value to control output signal amplitude.

FIG. 4A is a schematic that illustrates one of the methods for the use and implementation of a variable component. VSOURCE1 is a voltage source generating an arbitrary output waveform at node N401. Output voltage V0 at node N402 is a reduced amplitude representation of the voltage at node N401. The amplitude reduction is produced by a resistor divider network comprised of resistor R401 coupling node N401 to node N402 and a resistor equivalent comprised of the parallel combination of resistors R402 and R403, which couple node N402 to ground. Resistor R402 is variable and is used to compensate for variations in the values of resistors R401 and R403, thereby providing the desired ratio of the voltages at nodes N401 and N402. The current flowing through resistor R402 is IR402.

Figure 4B:
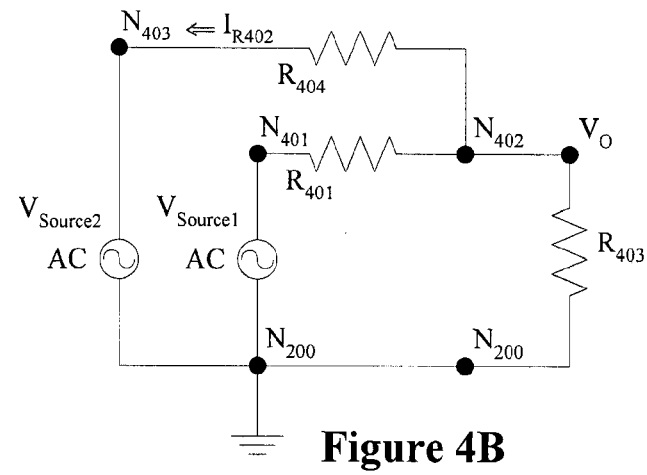
FIG. 4B is a circuit diagram illustrating means for realization of the component variability as illustrated in FIG. 4A.

An equivalent circuit for maintenance of the ratio of voltages at nodes N401 and N402 is shown in FIG. 4B. A second voltage source VSOURCE2 couples node N403 to ground and is connected in series with resistor R404, which couples node N403 to node N402. Voltage source VSOURCE2 and resistor R404 operate together such that the current through resistor R404 is IR402, the same as the current flowing through resistor R402 of FIG. 4A. Thus the combination of voltage source VSOURCE2 and resistor R404 is the functional equivalent of the variable resistor R402. Typically, the output of voltage source VSOURCE2 will be variable and the value of resistor R404 will be fixed.

Figure 4C:
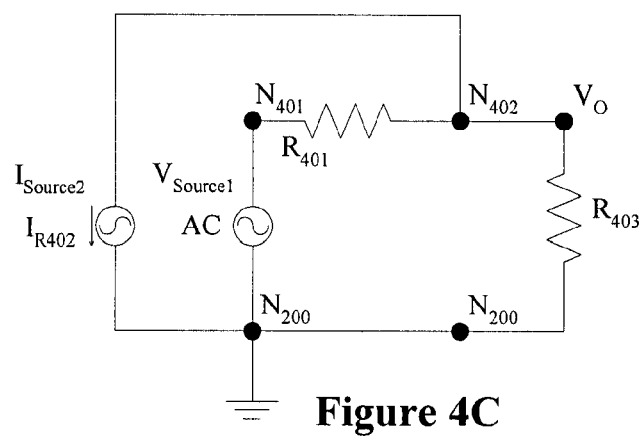
FIG. 4C is a circuit diagram illustrating alternate means for realization of component variability as illustrated in FIG. 4B.

FIG. 4C is an alternate representation to the circuit shown in FIG. 4B. Current source ISOURCE2 couples node N402 to ground and replaces the series combination of voltage source VSOURCE2 and resistor R404. The current supplied is IR402 so that the current source is the functional equivalent of variable resistor R403 in FIG. 4A. For the embodiments illustrated in FIGS. 3G, 3H, 3I, 6, 7, 8, 10, and 11, current source ISOURCE2 is provided directly by the output from a current output DAC. For the embodiment illustrated in FIG. 9, current source ISOURCE2 is provided by the combination of current output DAC DAC310 and current amplifier 900A.

Embodiment for Generic Passive Component Value Selection

As previously discussed, presently available DACs are often of limited use for the embodiment illustrated in FIG. 3G and the transimpedance amplifier embodiment illustrated in FIG. 3I. This can be due to the limited bandwidth of the analog reference input. While some devices have a reference bandwidth of several MHz, most are limited to approximately 500 KHz. For the present system, this would limit their utilization to audio applications or equivalent.

Figure 5A:
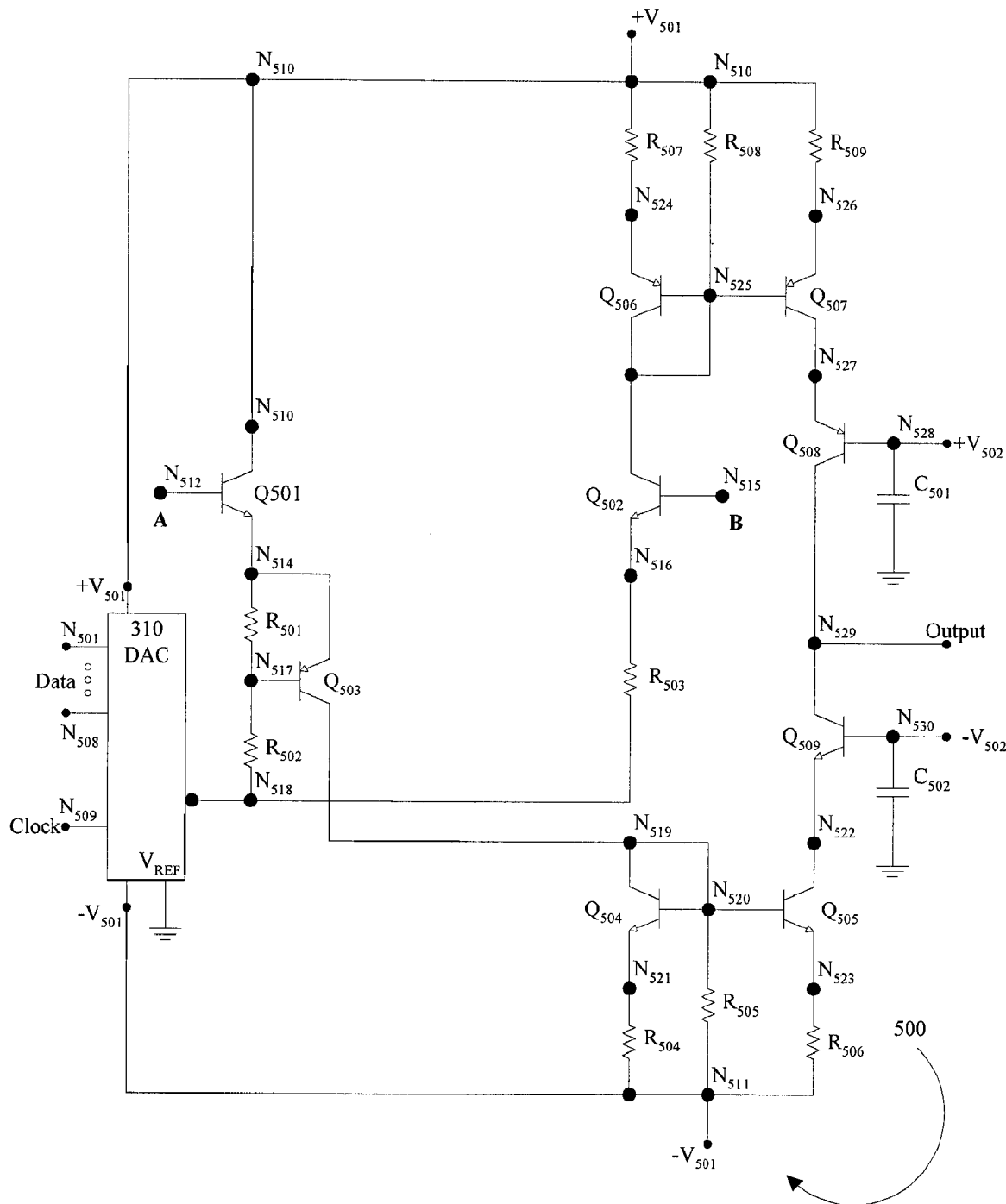
FIG. 5A is a circuit diagram of a single output embodiment of the present system.
Figure 5C:
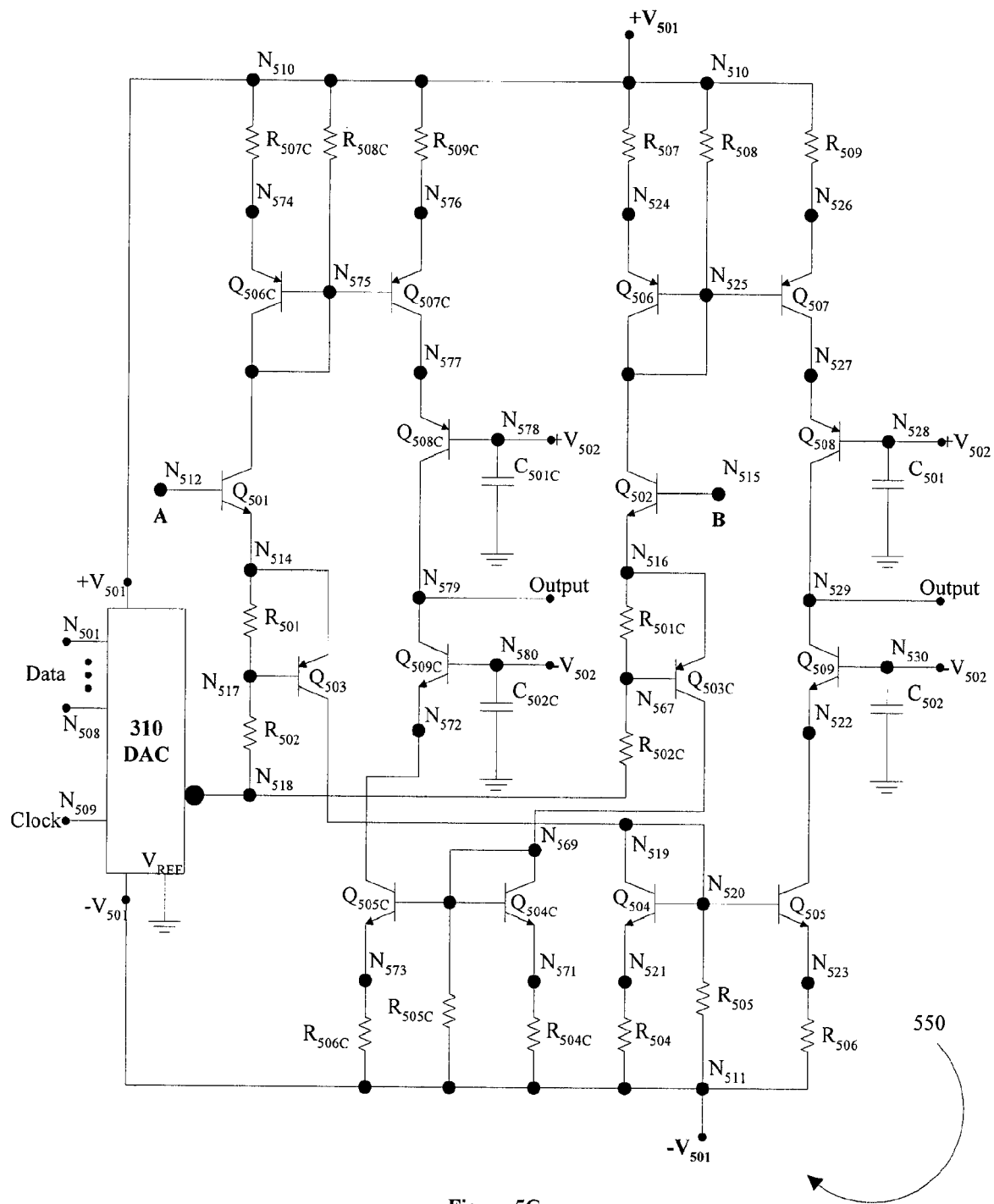
FIG. 5C is a circuit diagram of a differential output embodiment of the present system.
Figure 6:
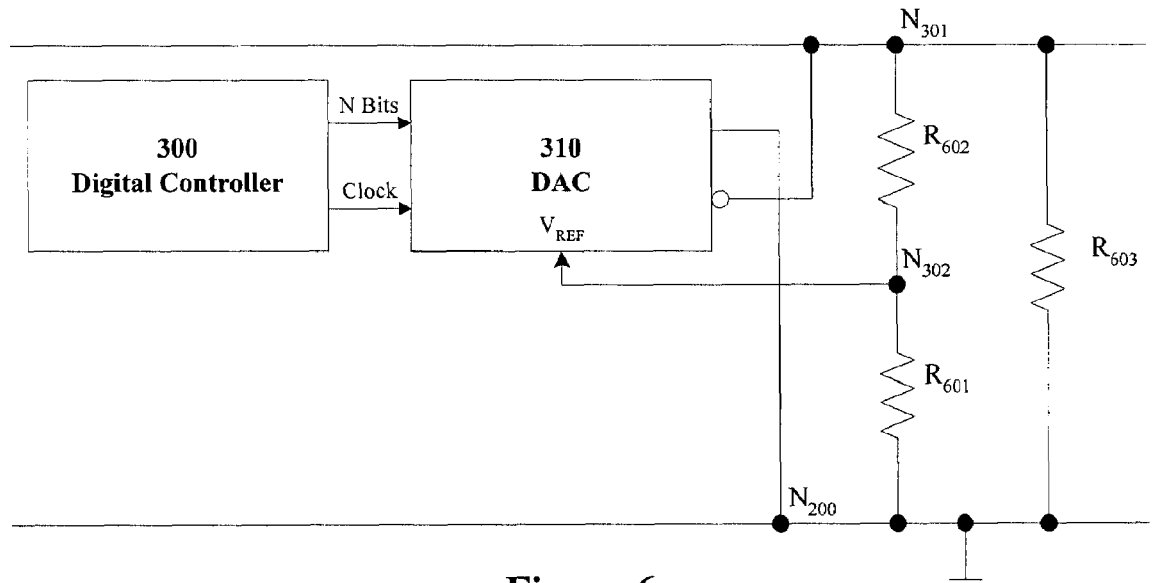
FIG. 6 is a functional block diagram of a variable resistor embodiment of the present system.
Figure 7:
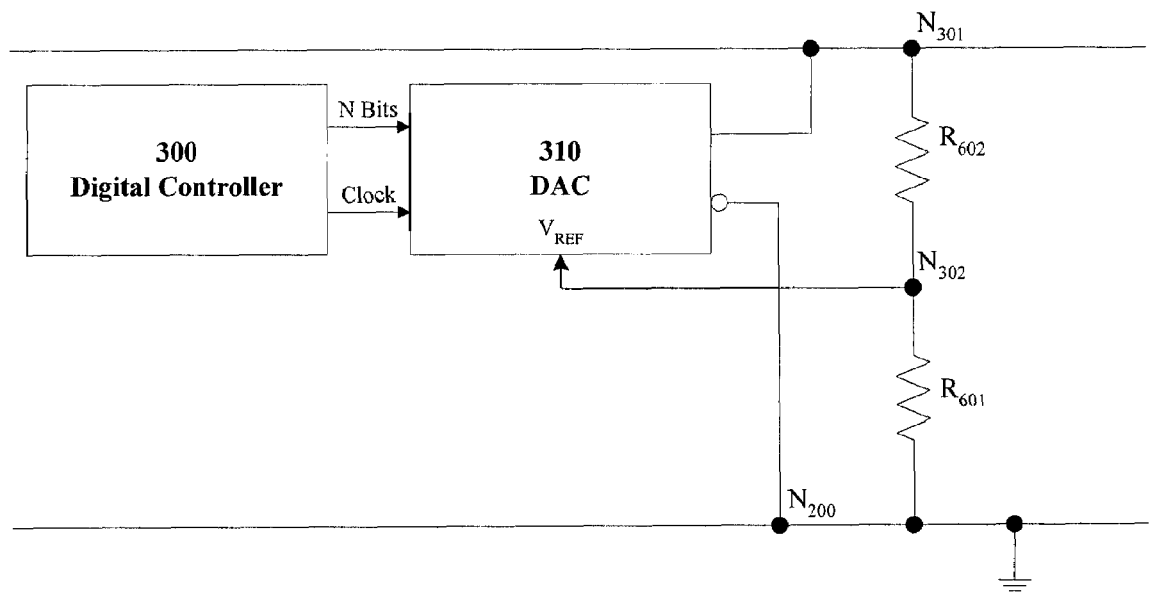
FIG. 7 is a functional block diagram of a variable resistor embodiment of the present system with alternate current feed polarity.

The embodiments illustrated in FIGS. 5A and 5C represent embodiments for realization of the highest level of speed and performance while avoiding the DAC reference limitations. These embodiments use the DAC in a configuration to set the gain of a differential amplifier. The differential amplifier functions as the input or sense element.

FIG. 5A shows a single-ended version for use with components in shunt to ground. FIG. 5C shows the more general double-ended circuit to be used with components between 2 arbitrary circuit nodes. The circuit of FIG. 5C can also be used with ground reference in place of that shown in FIG. 5A. Both of these configurations have the additional advantage of avoiding the problem with limited bandwidth for the reference input. Each has a high speed, differential amplifier input circuit that allow standard DACs to be used with a DC reference level, typically ground. The configuration shown in FIG. 5A is a single output version of the configuration of FIG. 5C.

High Current Embodiment

In addition to limited bandwidth of the reference input, another problem in using DACs of the present art is their limited output current capability. Many variable component applications simply require higher current levels than the 20 milliamperes that is the typical maximum output for most DACs. One solution to the current capacity problem would be to simply increase the current output capability of the DAC. However, this approach can only be used to achieve a limited increased before it would affect the nature and realization of the DAC integrated circuit and its functionality. Nevertheless, variable component values can be as valuable in high current power circuits as in low power digital processing and communications applications.

Figure 9:
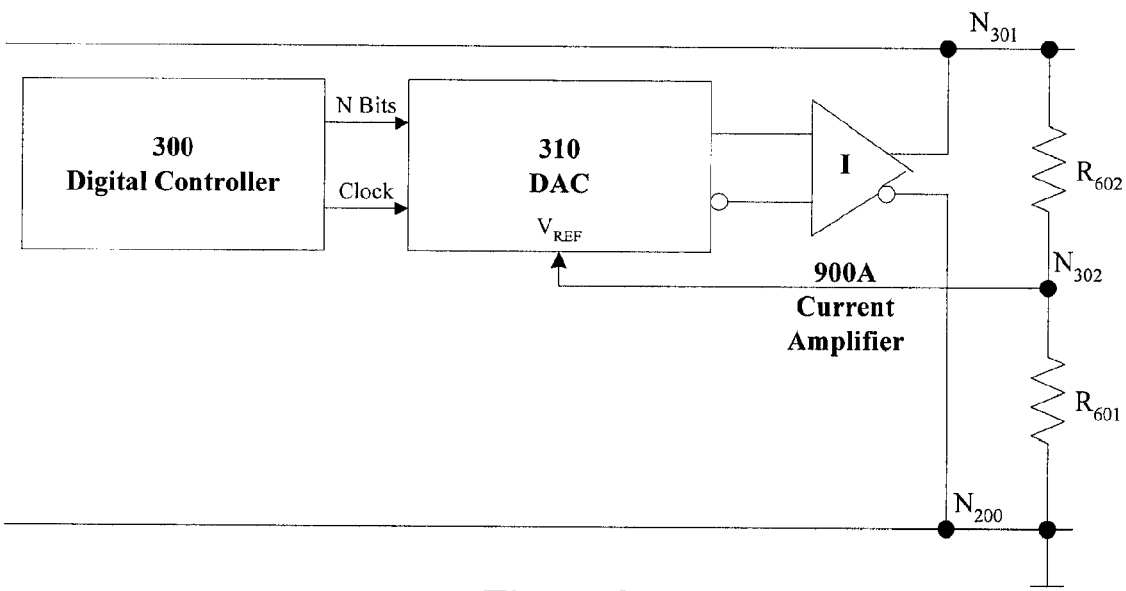
FIG. 9 is a functional block diagram of a high current, variable resistor embodiment of the present system.

A general solution involves the addition of a differential current amplifier to the output of the control DAC as shown in FIG. 9. The positive output of DAC DAC310 is coupled to the positive input of differential current amplifier 900A. The negative output of DAC DAC310 is coupled to the negative input of differential current amplifier 900A. The positive output of current amplifier 900A is coupled to resistor R602 at node N301. The negative output of current amplifier 900A is coupled to ground at node N200. As with previous configurations, the outputs of current amplifier 900A can be swapped with the negative output coupled to node N301 and the positive output coupled to ground at node N200, as long as the corresponding change is made to the digital input to DAC DAC310.

For high current applications, use of current amplifier 900A may be required. For moderately higher current applications up to a few amperes, the need for separate current amplifier 900A can be avoided by of an alternate embodiment. Two forms of such alternate embodiment are illustrated in FIGS. 5A and 5C implemented with single high current or multiple lower current output circuits, formed by the push-pull current mirrors. Use of the alternate embodiments of FIGS. 5A and 5C to resolve the problem of limited DAC current capability has the added advantage of simultaneously avoiding the problem of the limited bandwidth of the reference input previously described.

Component Value Selection Using Multiple Controls

Figure 11:
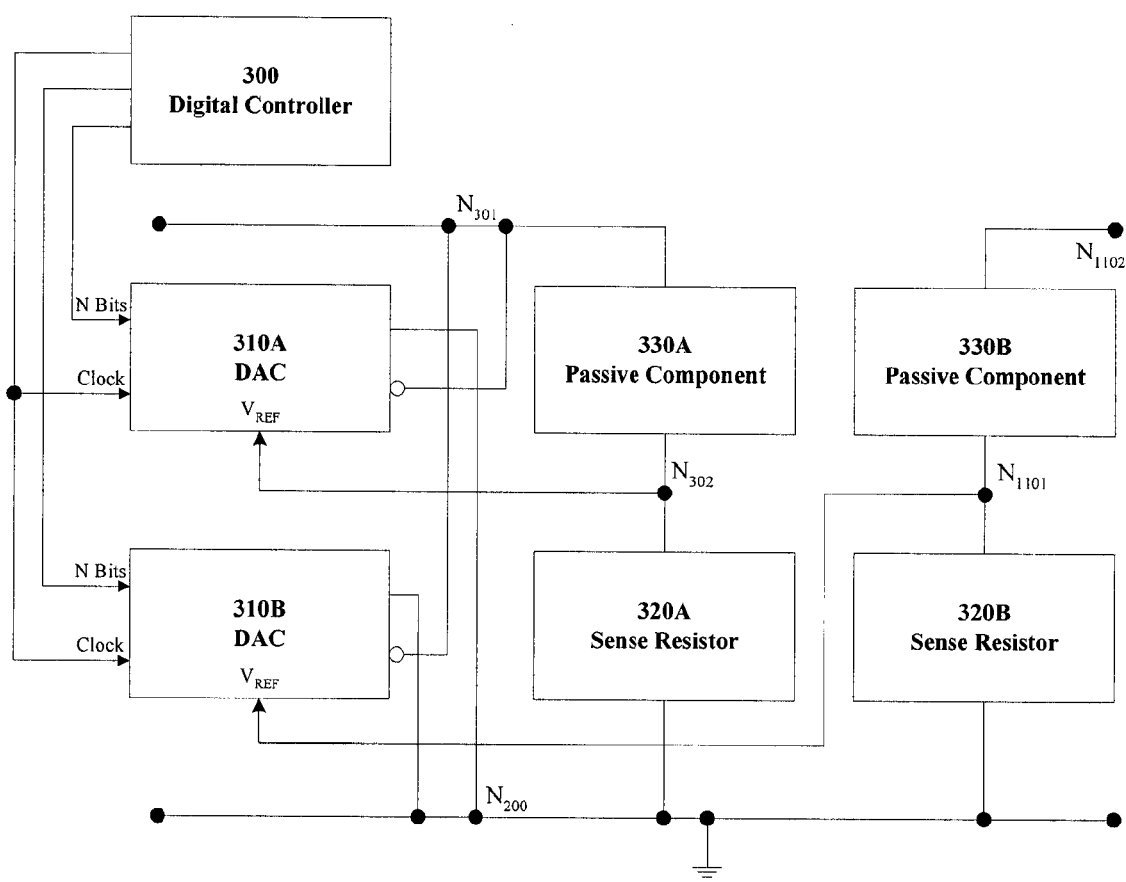
FIG. 11 is a functional block diagram of the present system illustrating open loop signal coupling from a second passive component to a first, variable passive component.

FIG. 11 illustrates a configuration wherein two separate DACs are used to vary a single component. Strictly speaking, this configuration alters the wave shape of the current flowing through the passive component 330A being varied such that it may no longer look like the same type of passive component. This may be mitigated if passive component 330B is the same type as 330A.

Use of this configuration is not likely to be a common occurrence since typically calibration routines controlled by Digital Controller 300 can accomplish the same results as an added mixed-signal circuit. The use of multiple controls has much greater potential for coupling signals into a single circuit.

Real Time Frequency Tracking Circuit Embodiments

A wide variety of electronic circuits either generate or are selectively responsive to different frequency signals. Examples are variable frequency oscillators or filters. Virtually any channelized system uses one or more tunable filters. Tuning requires either mechanical movement of a tuning element or use of a dynamically tracking device. Examples of the dynamically tracking devices include phase locked loops or devices that are able to affect the value of the reactance in a network. An example of the latter type of device can include a varactor diode that functions to tune the effective resonant frequency of a transmission line or cavity.

Figure 12:
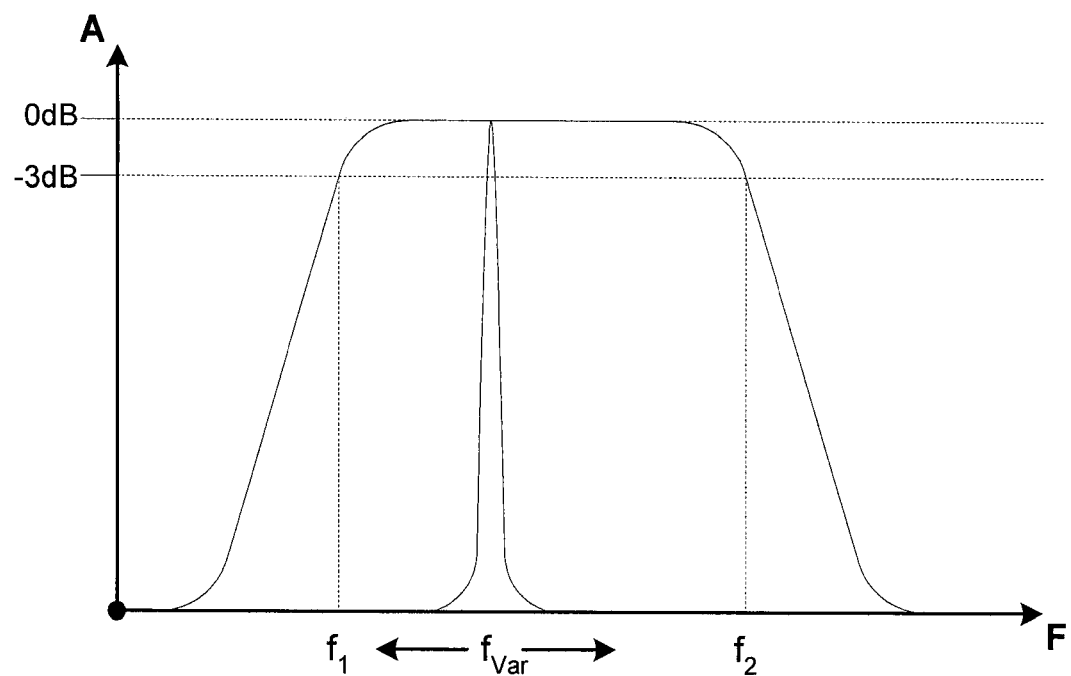
FIG. 12 is an illustration of the RF frequency characteristics of a tracking filter embodiment of the present system.
Figure 13:
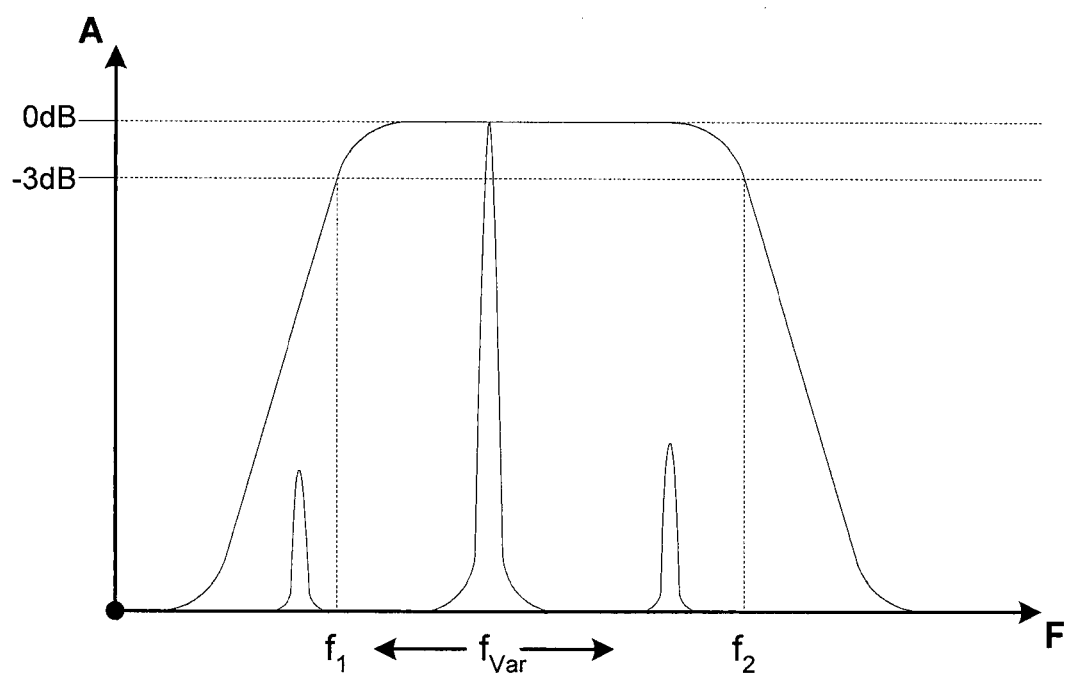
FIG. 13 is an illustration of the IF frequency characteristics of a tracking filter embodiment of the present system.

Historically, there have been a number of approaches to deal with the basic problem of differentiating a desired signal from the adjacent signals and noise sources. FIG. 12 illustrates a signal within a passband. Under this condition, the signal to noise ratio is good and standard processing approaches are adequate. FIG. 13 illustrates a more typical situation, simplified to three ac signals. The signal at a frequency below F1 is typically attenuated sufficiently such that it is not a problem unless it has an exceptionally large relative power. Of the two remaining signals inside the passband where the desired signal is the smaller of the two, a selection process should occur or the larger would dominate the detection process.

Figure 14:
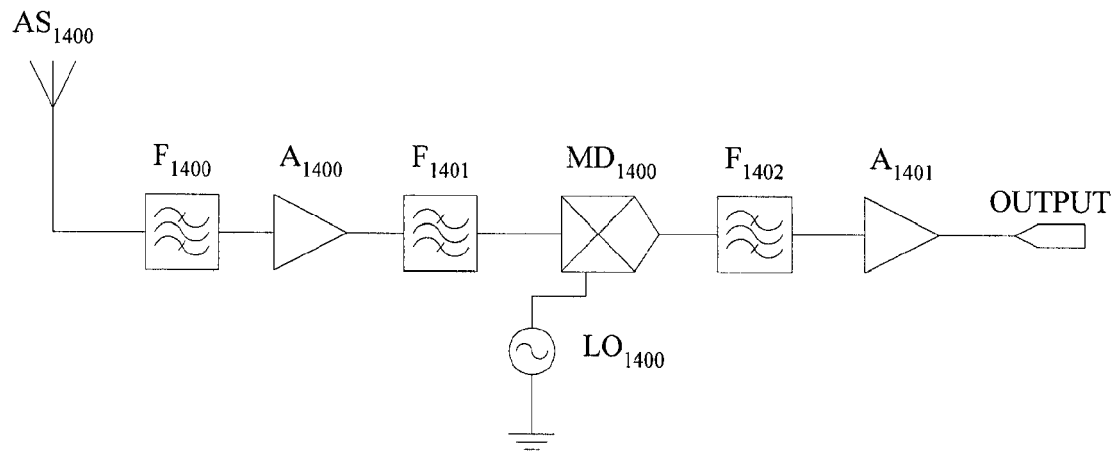
FIG. 14 is a functional block diagram of a generic receiver system employing conventional filters.

The typical selection process is illustrated in FIG. 14. Selection is accomplished by mixing the broadband, amplified and filtered received signal with the output of local oscillator LO1400 to generate the sum and difference frequencies. Filter F1402 follows the mixer and is typically designed to both pass the difference frequency and attenuate the sum frequency.

One problem associated with this approach results from the fact that mixers are non-linear devices. If an interfering signal is sufficiently large, the mixer is placed into compression and the output amplitude of the smaller, desired signal is badly attenuated. The result is the need for very high IP3 performance in the mixer with a resulting reduced ability to handle very small signals.

Figure 15:
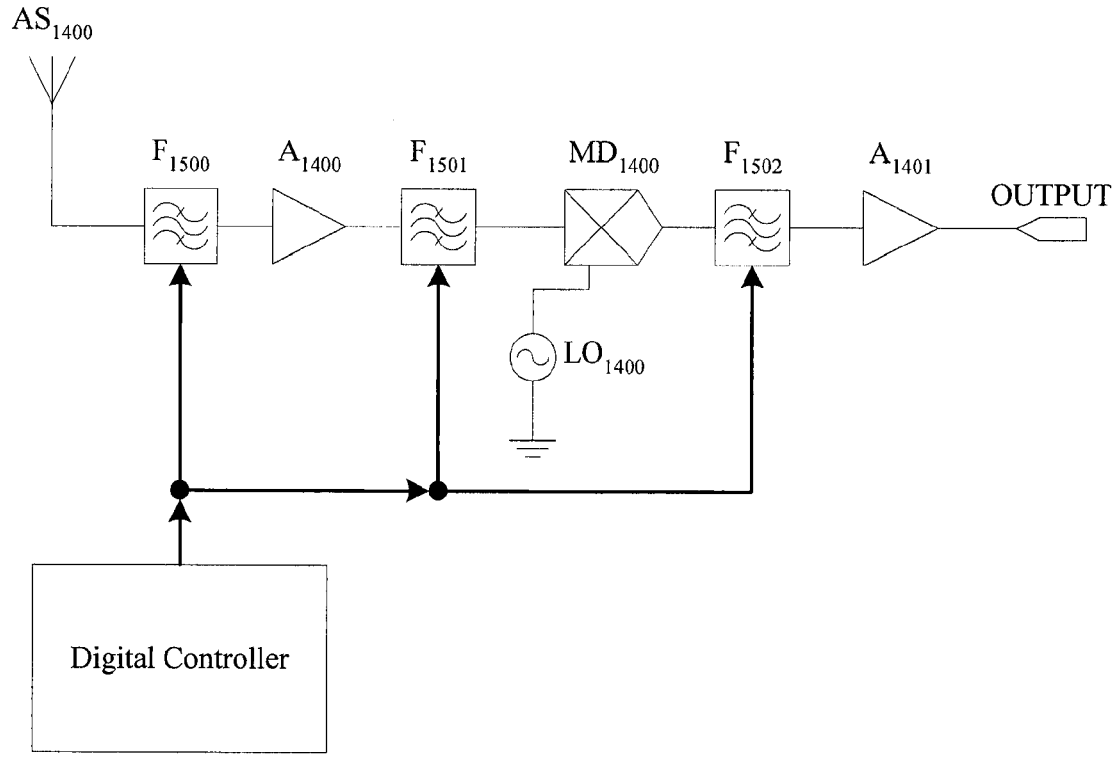
FIG. 15 is a functional block diagram of the generic receiver system of FIG. 14 implemented with multiple tracking filter embodiments of the present system.

FIG. 15 illustrates the embodiment of dynamically tunable filters in three different locations. The ability to make input filters F1500 and F1501 narrow-band compared to those that typically transmit the entire system passband, substantially reduces the interference from other signal/noise sources. For example, if the tracking filters have a bandwidth of 10% of the usual passband, the power of the "noise" compared to the desired signal power inside the passband of the tracking filter is typically reduce by a factor of 10, assuming a typical congested cell phone band as an example. This significantly reduces the IP3 requirements, reduces intermodulation products, and allows for better sensitivity of low amplitude signals. The use of a tracking/adjustable filter following the mixer allows for a much narrower band pass because the component variations associated with manufacturing processes can be reduced to insignificance.

A cascaded, double conversion process using two, offset IF frequencies is commonly used to increase selectivity. Dynamically adjustable filters used with the cascaded selection improves the signal to noise ratio substantially beyond a basic approach as illustrated in FIG. 15. Clearly these are a multitude of reactive networks used to filter or otherwise manipulate the frequency characteristics of such systems. The following discussion will be focused on the most simple, and easily implemented form of adjustable filter, the ground referenced parallel L-C network.

In order to maintain specific impedance for a filter, both the L and C components should be independently controlled. In general, this requires the use of two DACs and two feedback networks. By sensing and controlling both types of reactive components it is possible to control both the center frequency and the impedance of the network at the same time thereby allowing adjustable frequency and impedance control at any given frequency within the band. In special cases, two sense control currents maybe fed back by way of a single current buffer into a common node.

Another embodiment uses a single DAC and feedback circuit that affects the performance of a network of components rather than an individual L or C. For the series LC tank circuit, one node is AC grounded and a signal is applied to the other. This circuit would function as a simple notch filter. It is well known that all components have parasitic resistance associated with them and this example has two. Applying the DAC and feedback system to the entire filter permits a reduction in the effective parasitic resistance of the network rather than varying the individual element values and without affecting the resonant frequency of the network. The result is a very high-unloaded Q, and a lower insertion loss for the network system. The lower loss and higher Q permit use of narrower filter bandwidths and can also provide some of the benefits associated with super cooled circuits, lower thermal noise and greater frequency selectivity. This structure can be applied to more complicated network structures, to allowing them to more closely approach the functionality of ideal components than with present circuit structures.

Thus, variable passive components with high resolution, digital value selection and control have been described.

We claim:

1. A circuit comprising:
a passive component coupled between a first node and a second node;
a digital-to-analog converter having a first output coupled to the first node and a second output coupled to a third node, and having a reference input coupled to the second node;
a controller coupled to the digital-to-analog converter;
a sense resistor coupled between the second node and the third node.

2. The circuit of claim 1 wherein the third node is ground.

3. The circuit of claim 1 wherein the passive component is a resistor.

4. The circuit of claim 1 wherein the passive component is a capacitor.

5. The circuit of claim 1 wherein the passive component is an inductor.

6. The circuit of claim 1 wherein the reference input is a voltage reference.

7. The circuit of claim 1 wherein the controller is a digital controller for controlling the digital-to-analog converter.

8. A circuit comprising:
a sense resistor coupled between a first node and a second node;
a digital-to-analog converter having a first output coupled to the first node and a second output coupled to a third node, and having a reference input coupled to the second node;
a controller coupled to the digital-to-analog converter;
a passive component coupled between the second node and the third node.

9. The circuit of claim 8 wherein the third node is ground.

10. The circuit of claim 8 wherein the passive component is a resistor.

11. The circuit of claim 8 wherein the passive component is a capacitor.

12. The circuit of claim 8 wherein the passive component is an inductor.

13. The circuit of claim 8 wherein the reference input is a voltage reference.

14. The circuit of claim 8 wherein the controller is a digital controller for controlling the digital-to-analog converter.

* * * * *